(12) United States Patent
Trika et al.

(10) Patent No.: US 12,430,208 B2
(45) Date of Patent: *Sep. 30, 2025

(54) ON-SSD ERASURE CODING WITH UNI-DIRECTIONAL COMMANDS

(71) Applicant: SK Hynix NAND Product Solutions Corp., Rancho Cordova, CA (US)

(72) Inventors: Sanjeev Trika, Portland, OR (US); Gregory Tucker, Chandler, AZ (US); James Harris, Chandler, AZ (US); Jonathan Hughes, Longmont, CO (US); Piotr Wysocki, Pomorskie (PL); Gang Cao, Shanghai (CN); Qihua Dai, Shanghai (CN); Benjamin Walker, Chandler, AZ (US); Ziye Yang, Shanghai (CN); Xiaodong Liu, Shanghai (CN); Changpeng Liu, Shanghai (CN); Jackson Ellis, Fort Collins, CO (US)

(73) Assignee: SK Hynix NAND Product Solutions Corp., Rancho Cordova, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/618,965

(22) Filed: Mar. 27, 2024

(65) Prior Publication Data
US 2024/0241792 A1    Jul. 18, 2024

Related U.S. Application Data

(63) Continuation of application No. 17/801,417, filed as application No. PCT/CN2020/076072 on Feb. 20, 2020, now Pat. No. 11,971,782.

(51) Int. Cl.
*G06F 11/10*    (2006.01)

(52) U.S. Cl.
CPC ........ *G06F 11/108* (2013.01); *G06F 11/1068* (2013.01)

(58) Field of Classification Search
None
See application file for complete search history.

(56) References Cited

U.S. PATENT DOCUMENTS

| 5,574,882 A | 11/1996 | Menon et al. |
| 2002/0166078 A1 | 11/2002 | Oldfield et al. |

(Continued)

FOREIGN PATENT DOCUMENTS

| CN | 1776636 A | 5/2006 |
| CN | 103988182 A | 8/2014 |

(Continued)

OTHER PUBLICATIONS

H. Akutsu, T. Yamamoto, K. Ueda and H. Saito, "MEC: Network Optimized Multi-stage Erasure Coding for Scalable Storage Systems," 2017 IEEE 22nd Pacific Rim International Symposium on Dependable Computing (PRDC), Christchurch, New Zealand, 2017, pp. 292-300, (Year: 2017).*

(Continued)

*Primary Examiner* — Daniel F. McMahon
(74) *Attorney, Agent, or Firm* — Haley Guiliano LLP

(57) ABSTRACT

Systems and methods for a controller including controller memory and logic are presented herein. The logic is configured to control access to a persistent storage media and, in response to one or more commands, determine an intermediate parity value based on a first parity calculation by sending a uni-directional command to the persistent storage media. The logic is further configured to store, in the controller memory, the intermediate parity value, and determine a final parity value based on the intermediate parity value and a second parity calculation.

27 Claims, 11 Drawing Sheets

(56) References Cited

U.S. PATENT DOCUMENTS

| | | | |
|---|---|---|---|
| 2005/0055622 A1 | 3/2005 | Tsukamizu | |
| 2006/0123268 A1 | 6/2006 | Forhan et al. | |
| 2013/0290777 A1 | 10/2013 | Yoshihara | |
| 2016/0085625 A1 | 3/2016 | Amato et al. | |
| 2016/0259687 A1 | 9/2016 | Yoshihara et al. | |
| 2017/0322845 A1* | 11/2017 | Nomura | G06F 3/0689 |
| 2018/0039425 A1 | 2/2018 | Li | |
| 2019/0050161 A1 | 2/2019 | Wysocki et al. | |
| 2019/0087122 A1 | 3/2019 | Shinozuka et al. | |
| 2019/0087272 A1 | 3/2019 | Lingarajappa | |
| 2023/0082403 A1 | 3/2023 | Trika et al. | |

FOREIGN PATENT DOCUMENTS

| | | |
|---|---|---|
| CN | 108352845 A | 7/2018 |
| CN | 110383251 A | 10/2019 |
| JP | 2002278708 A1 | 9/2002 |
| WO | 2016194095 A1 | 12/2016 |
| WO | 2018051505 A1 | 3/2018 |

OTHER PUBLICATIONS

International Search report for PCT/CN2020/076072, dated Nov. 23, 2020 (2 pages).

* cited by examiner

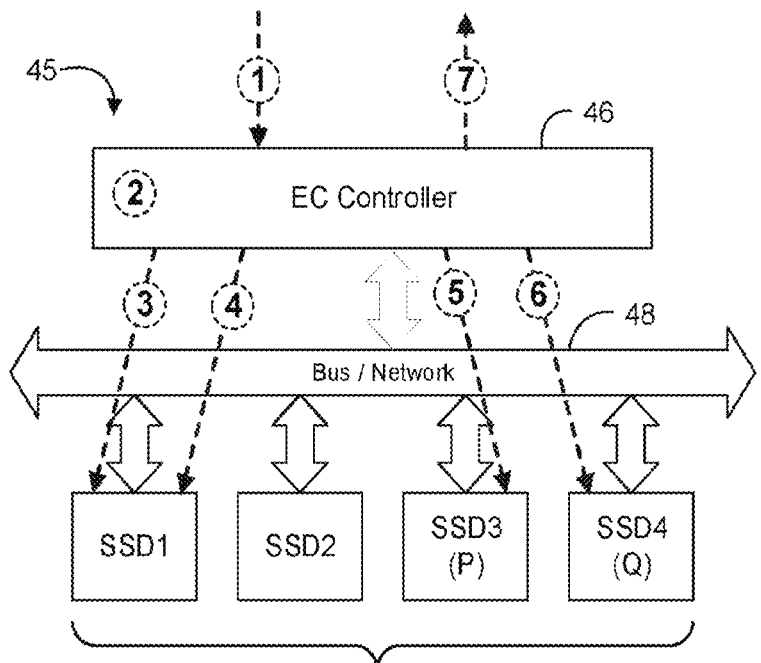

FIG. 4A

| # | EC Controller Operation | Disk Operation |
|---|---|---|
| 1 | Receive command: Write(L', D1) | |
| 2 | Allocate IDX1 for SSD1, and space at address M1 in EC controller memory | |
| 3 | Issue command: WriteAndXor(L1, D1, IDX1) | $Y_{IDX1} \leftarrow$ Read(L1) XOR D1<br>Write(L1, D1) |
| 4 | Issue command: SaveEC(IDX1, M1) | M1 $\leftarrow Y_{IDX1}$ |
| 5 | Issue command: ECwrite(L1, X1, $g_0$) | $Y_0 \leftarrow$ Read(L1)<br>Write(L1, $Y_0$ XOR $g_0$*X1) |
| 6 | Issue command: ECwrite(L1, X1, $g_1$) | $Y_1 \leftarrow$ Read(L1)<br>Write(L1, $Y_1$ XOR $g_1$*X1) |
| 7 | Send completion to application | |

FIG. 4B

| Dword | Byte 0 | | Byte 1 | | Byte 2 | | Byte 3 | |
|---|---|---|---|---|---|---|---|---|
| | 0 | 7 | 8 | 15 | 16 | 23 | 24 | 31 |
| | ECrmw Command | | | | | | | |
| 15 | ELB Application Tag | | | | ELB Application Tag Mask | | | |
| 14 | Expected Initial Logical Block Ref Tag | | | | | | | |
| 13 | Dataset Mgmt | | Rsvd | | | | | |
| 12 | Num LBA | | | | Coefficient | | Rsvd / Prot / F / R | |
| 11 | Last Parity LBA | | | | | | | |
| 10 | | | | | | | | |
| 9 | PRP 2 | | | | | | | |
| 8 | | | | | | | | |
| 7 | PRP 1 | | | | | | | |
| 6 | | | | | | | | |
| 5 | Meta Pointer | | | | | | | |
| 4 | | | | | | | | |
| 3 | Next Parity LBA | | | | | | | |
| 2 | | | | | | | | |
| 1 | Namespace ID | | | | | | | |
| 0 | Op: 01h / 02h | | Fs | Rsvd | PS | | Command Identifier | |

ON-SSD ERASURE CODING WITH UNI-DIRECTIONAL COMMANDS

CROSS REFERENCE TO RELATED APPLICATIONS

This application is a continuation of U.S. patent application Ser. No. 17/801,417, filed Aug. 22, 2022, which is a national stage application under 35 U.S.C. § 371 of International Application No. PCT/CN2020/076072, filed Feb. 20, 2020, which are incorporated by reference herein in their entireties.

TECHNICAL FIELD

Embodiments generally relate to electronic storage systems. More particularly, embodiments relate to on-solid state drive (SSD) erasure coding with uni-directional commands.

BACKGROUND

Some storage systems use erasure-coding (EC) technology and corresponding data layouts for volume member drives for improving data reliability and durability. Examples of EC systems include redundant array of independent disks (RAID) systems such as RAID5, RAID6, etc. with one or two additional drives in a volume, and M+P (e.g., 6+3) EC utilized in some cloud-storage systems, for the purpose of staging redundant data. More generally, in an M+P EC configuration, M+P drives are used to encode data originally intended to be stored on M drives, by using P additional drives. The stored data across the drives includes P drives' worth of parity data that is used to recover the system from failure of up to P drives.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIG. 4A is a block diagram of an example of an electronic storage system according to an embodiment;

FIG. 4B is a table of an example of an EC controller operation and a corresponding drive operation according to an embodiment;

FIG. 7 is an illustrative diagram of an example of a command format according to an embodiment;

DESCRIPTION OF EMBODIMENTS

Figure 1:
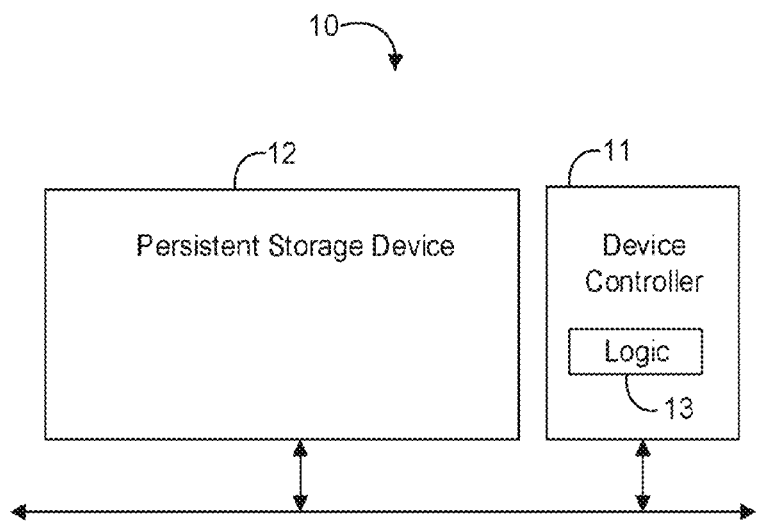
FIG. 1 is a block diagram of an example of an electronic storage device according to an embodiment.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

While the following description sets forth various implementations that may be manifested in architectures such as system-on-a-chip (SoC) architectures for example, implementation of the techniques and/or arrangements described herein are not restricted to particular architectures and/or computing systems and may be implemented by any architecture and/or computing system for similar purposes. For instance, various architectures employing, for example, multiple integrated circuit (IC) chips and/or packages, and/or various computing devices and/or consumer electronic (CE) devices such as set top boxes, smartphones, etc., may implement the techniques and/or arrangements described herein. Further, while the following description may set forth numerous specific details such as logic implementations, types and interrelationships of system components, logic partitioning/integration choices, etc., claimed subject matter may be practiced without such specific details. In other instances, some material such as, for example, control structures and full software instruction sequences, may not be shown in detail in order not to obscure the material disclosed herein.

The material disclosed herein may be implemented in hardware, firmware, software, or any combination thereof. The material disclosed herein may also be implemented as instructions stored on a machine-readable medium, which may be read and executed by one or more processors. A machine-readable medium may include any medium and/or mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others.

References in the specification to "one implementation", "an implementation", "an example implementation", etc., indicate that the implementation described may include a particular feature, structure, or characteristic, but every embodiment may not necessarily include the particular feature, structure, or characteristic. Moreover, such phrases are not necessarily referring to the same implementation. Further, when a particular feature, structure, or characteristic is described in connection with an embodiment, it is submitted that it is within the knowledge of one skilled in the art to effect such feature, structure, or characteristic in connection with other implementations whether or not explicitly described herein.

Various embodiments described herein may include a memory component and/or an interface to a memory component. Such memory components may include volatile and/or nonvolatile (NV) memory. Volatile memory may be a storage medium that requires power to maintain the state of data stored by the medium. Non-limiting examples of volatile memory may include various types of random access memory (RAM), such as dynamic RAM (DRAM) or static RAM (SRAM). One particular type of DRAM that may be used in a memory module is synchronous dynamic RAM (SDRAM). In particular embodiments, DRAM of a memory component may comply with a standard promulgated by Joint Electron Device Engineering Council (JEDEC), such as JESD79F for double data rate (DDR) SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at jedec.org). Such standards (and similar standards) may be referred to as DDR-based standards and communication interfaces of the storage devices that implement such standards may be referred to as DDR-based interfaces.

NV memory (NVM) may be a storage medium that does not require power to maintain the state of data stored by the medium. In one embodiment, the memory device may include a block addressable memory device, such as those based on NAND or NOR technologies. A memory device may also include future generation nonvolatile devices, such as a three dimensional (3D) crosspoint memory device, or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor RAM (FeTRAM), anti-ferroelectric memory, magnetoresistive RAM (MRAM) memory that incorporates memristor technology, resistive memory including the metal oxide base, the oxygen vacancy base and the conductive bridge RAM (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The memory device may refer to the die itself and/or to a packaged memory product. In particular embodiments, a memory component with non-volatile memory may comply with one or more standards promulgated by the JEDEC, such as JESD218, JESD219, JESD220-1, JESD223B, JESD223-1, or other suitable standard (the JEDEC standards cited herein are available at jedec.org).

With reference to FIG. 1, an embodiment of an electronic storage device 10 may include persistent storage media 12, and a device controller 11 communicatively coupled to the persistent storage media 12. The device controller 11 may include logic 13 to control local access to the persistent storage media 12 (e.g., command logic, control logic, device logic, etc. for the device 10 itself). In response to one or more commands, for example, the logic 13 may be configured to determine an intermediate parity value based on a first local parity calculation, and locally store the intermediate parity value. For example, the logic 13 may be further configured to determine a final parity value based on the intermediate parity value and a second local parity calculation, in response to the one or commands. In some embodiments, in response to a first uni-directional command, the logic 13 may be configured to read an old data value from a first address indicated in the first uni-directional command, perform an exclusive-or (XOR) operation on the old data value and a new data value indicated in the first uni-directional command to determine the intermediate parity value, and locally store the intermediate parity value at a first location associated to a first index indicated in the first uni-directional command. For example, in response to the first uni-directional command, the logic 13 may be further configured to write the new data at the first address. In some embodiments, in response to a second uni-directional command, the logic 13 may be configured to read an intermediate parity value from a second location associated to a second index indicated in the second uni-directional command, and store the intermediate parity value at a second address indicated in the second uni-directional command.

In some embodiments, in response to a third uni-directional command, the logic 13 may be further configured to read an old parity data value from a third address indicated in the third uni-directional command, and locally store the old parity data value at a third location associated to a third index indicated in the third uni-directional command. For example, in response to the third uni-directional command, the logic 13 may be further configured to perform the second parity calculation based on the old parity data value, an intermediate parity value indicated in the third uni-directional command, and a coefficient value indicated in the third uni-directional command to determine the final parity value, and write the final parity value at the third address.

In some embodiments, in response to a fourth uni-directional command, the logic 13 may be further configured to read an old data value from a fourth address indicated in the fourth uni-directional command, perform an XOR operation on the old data value and a new data value indicated in the fourth uni-directional command to determine the intermediate parity value, perform a multiplication operation based on the intermediate parity value and a coefficient value indicated in the fourth uni-directional command to determine the final parity value, and write the final parity value at a fifth address indicated in the fourth uni-directional command. In any of the embodiments herein, the persistent storage media 12 may comprise a solid state drive (SSD), a hard disk drive (HDD), etc.

Embodiments of each of the above device controller 11, persistent storage media 12, logic 13, and other device components may be implemented in hardware, software, or any suitable combination thereof. For example, hardware implementations may include configurable logic such as, for example, programmable logic arrays (PLAs), field programmable gate arrays (FPGAs), complex programmable logic devices (CPLDs), or fixed-functionality logic hardware using circuit technology such as, for example, application specific integrated circuit (ASIC), complementary metal oxide semiconductor (CMOS) or transistor-transistor logic (TTL) technology, or any combination thereof. Embodiments of the device controller 11 may include a general purpose controller, a special purpose controller, a memory controller, a storage controller, a micro-controller, a general purpose processor, a special purpose processor, a central processor unit (CPU), an execution unit, etc. In some embodiments, the persistent storage media 12, and/or the logic 13 may be located in, or co-located with, various components, including the device controller 11 (e.g., on a same die, in a same package, in a same housing, etc.).

Alternatively, or additionally, all or portions of these components may be implemented in one or more modules as a set of logic instructions stored in a machine- or computer-readable storage medium such as random access memory (RAM), read only memory (ROM), programmable ROM (PROM), firmware, flash memory, etc., to be executed by a processor or computing device. For example, computer program code to carry out the operations of the components may be written in any combination of one or more operating system (OS) applicable/appropriate programming languages, including an object-oriented programming language such as PYTHON, PERL, JAVA, SMALLTALK, C++, C# or the like and conventional procedural programming languages, such as the "C" programming language or similar programming languages. For example, the persistent storage media 12, other persistent storage media, or other device memory may store a set of instructions which when executed by the device controller 11 cause the device 10 to implement one or more components, features, or aspects of the device 10 (e.g., the logic 13, determining the intermediate parity value based on the first local parity calculation, locally storing the intermediate parity value, determining the final parity value based on the intermediate parity value and a second local parity calculation, etc.).

Figure 2:
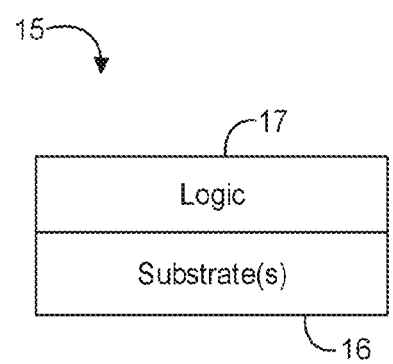
FIG. 2 is a block diagram of an example of an electronic apparatus according to an embodiment.
Figure 3A:
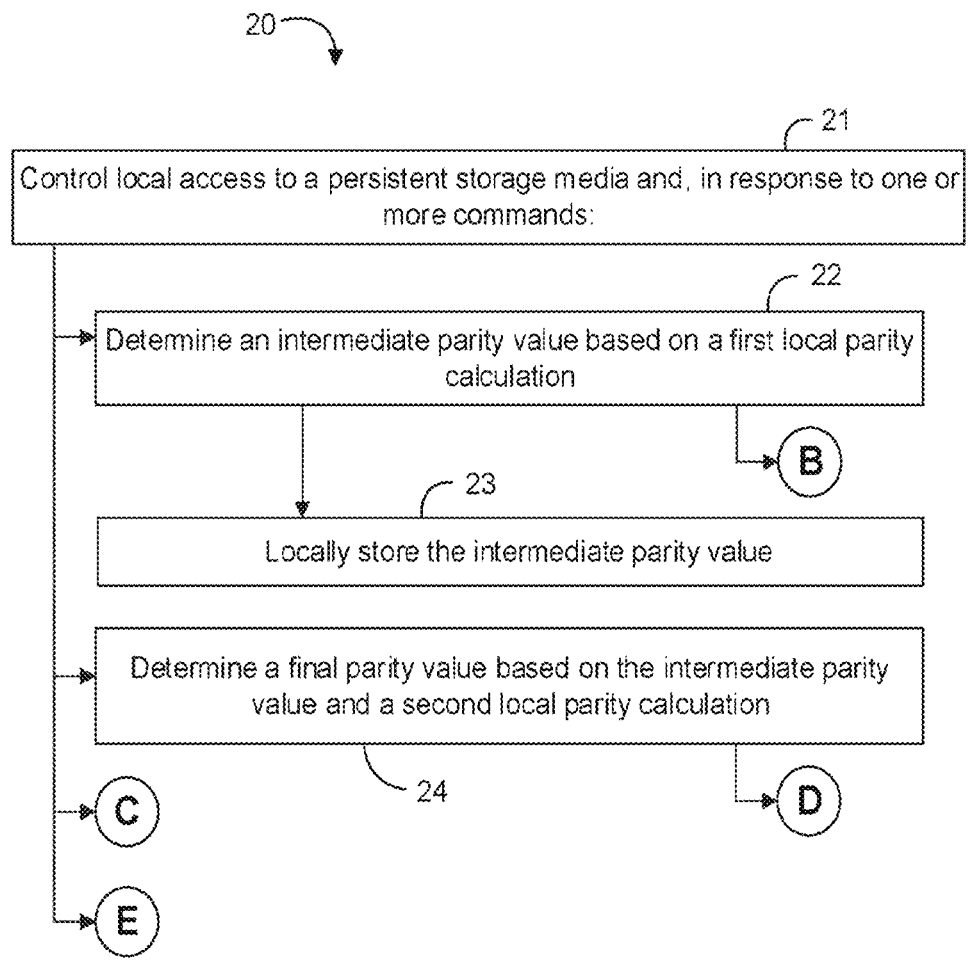
FIGS. 3A to 3E are flowcharts of an example of a method of controlling a storage device according to an embodiment.
Figure 3B:
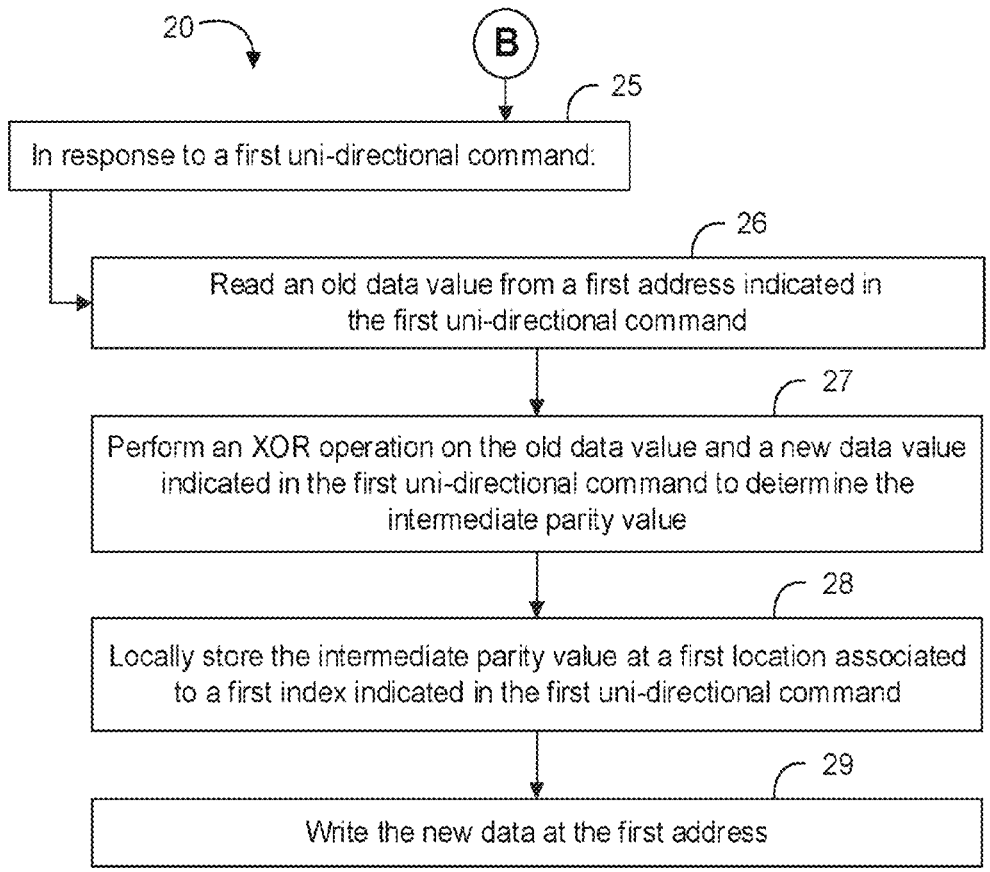
Figure 3C:
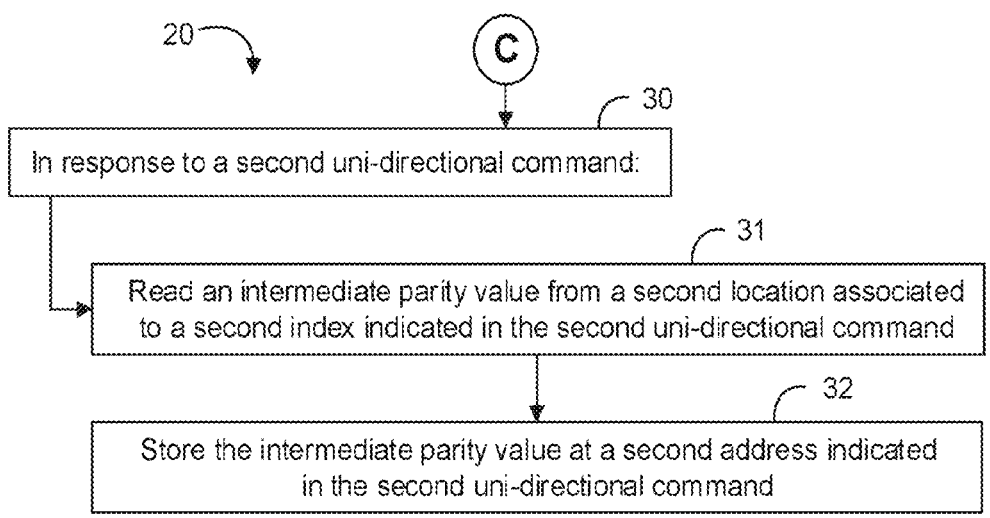
Figure 3D:
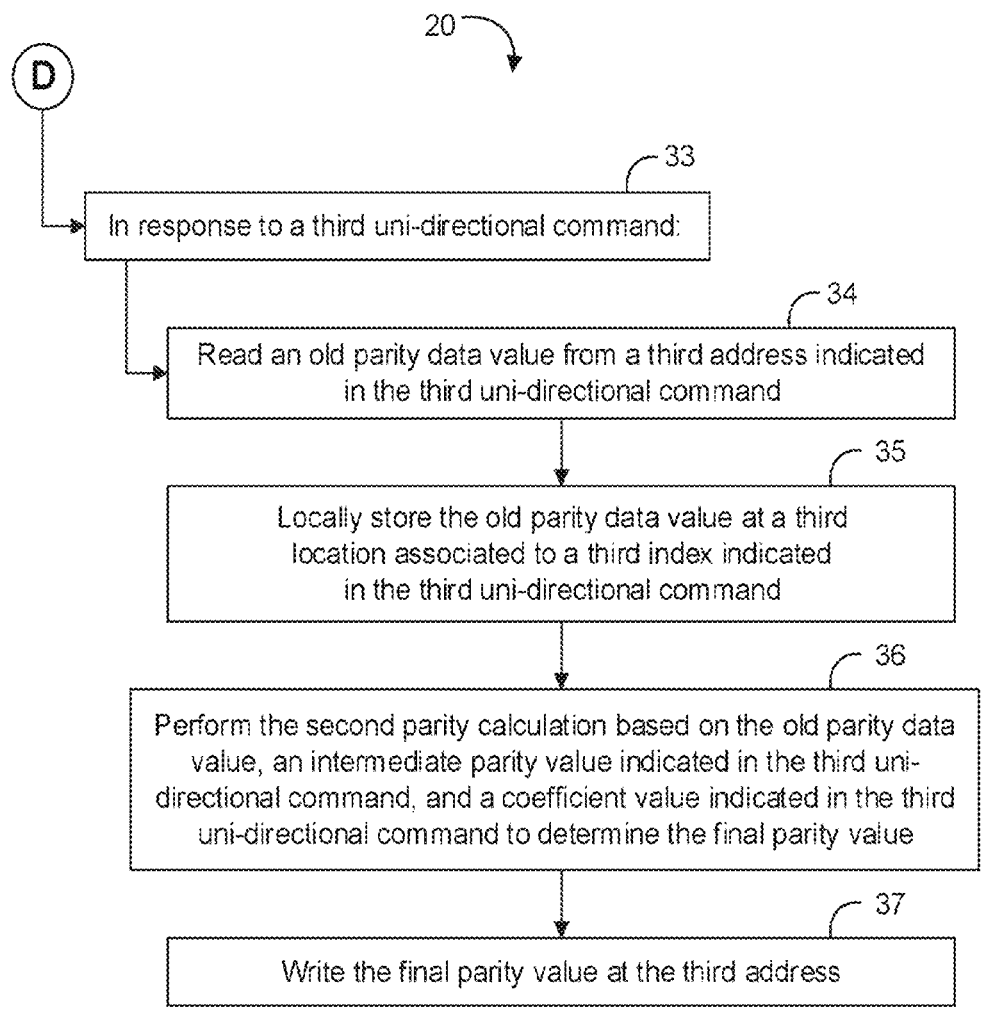
Figure 3E:
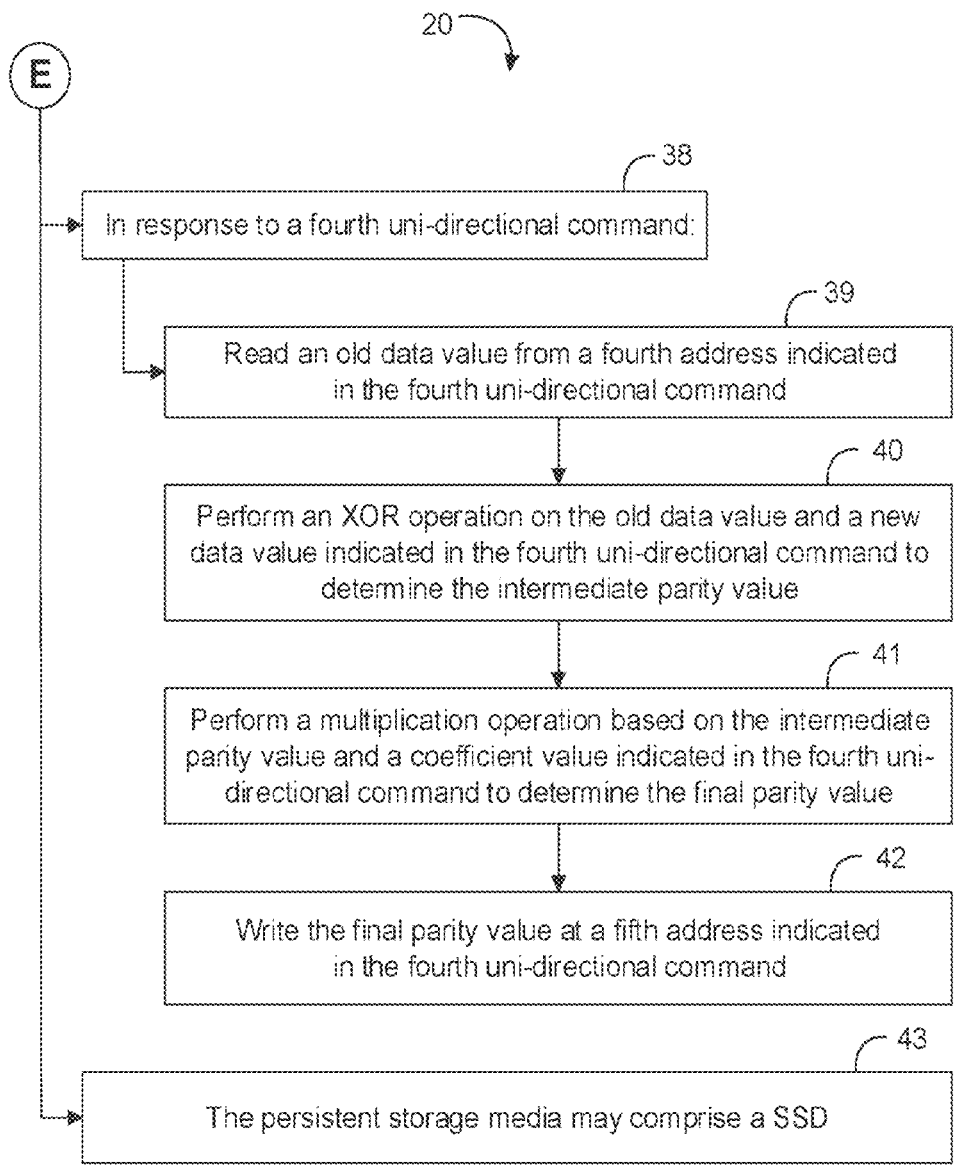

Turning now to FIG. 2, an embodiment of an electronic apparatus 15 may include one or more substrates 16, and logic 17 coupled to the one or more substrates 16. The logic 17 may be configured to control local access to a persistent storage media and, in response to one or more commands, to determine an intermediate parity value based on a first local parity calculation and locally store the intermediate parity value. For example, the logic 17 may be further configured to determine a final parity value based on the intermediate parity value and a second local parity calculation, in response to the one or more commands. In some embodiments, in response to a first uni-directional command, the logic 17 may be configured to read an old data value from a first address indicated in the first uni-directional command, perform an XOR operation on the old data value and a new data value indicated in the first uni-directional command to determine the intermediate parity value, and locally store the intermediate parity value at a first location associated to a first index indicated in the first uni-directional command. For example, in response to the first uni-directional command, the logic 17 may be further configured to write the new data at the first address. In some embodiments, in response to a second uni-directional command, the logic 17 may be configured to read an intermediate parity value from a second location associated to a second index indicated in the second uni-directional command, and store the intermediate parity value at a second address indicated in the second uni-directional command.

In some embodiments, in response to a third uni-directional command, the logic 17 may be further configured to read an old parity data value from a third address indicated in the third uni-directional command, and locally store the old parity data value at a third location associated to a third index indicated in the third uni-directional command. For example, in response to the third uni-directional command, the logic 17 may be further configured to perform the second parity calculation based on the old parity data value, an intermediate parity value indicated in the third uni-directional command, and a coefficient value indicated in the third uni-directional command to determine the final parity value, and write the final parity value at the third address.

In some embodiments, in response to a fourth uni-directional command, the logic 17 may be further configured to read an old data value from a fourth address indicated in the fourth uni-directional command, perform an XOR operation on the old data value and a new data value indicated in the fourth uni-directional command to determine the intermediate parity value, perform a multiplication operation based on the intermediate parity value and a coefficient value indicated in the fourth uni-directional command to determine the final parity value, and write the final parity value at a fifth address indicated in the fourth uni-directional command. In any of the embodiments herein, the persistent storage media may comprise a SSD.

Embodiments of the logic 17 may be implemented in a system, apparatus, computer, device, etc., for example, such as those described herein. More particularly, hardware implementations of the logic 17 may include configurable logic such as, for example, PLAs, FPGAs, CPLDs, or in fixed-functionality logic hardware using circuit technology such as, for example, ASIC, CMOS, or TTL technology, or any combination thereof. Alternatively, or additionally, the logic 17 may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C# or the like and conventional procedural programming languages, such as the "C" programming language or similar programming languages.

For example, the logic 17 may be implemented on a semiconductor apparatus which may include the one or more substrates 16, with the logic 17 coupled to the one or more substrates 16. In some embodiments, the logic 17 may be at least partly implemented in one or more of configurable logic and fixed-functionality hardware logic on semiconductor substrate(s) (e.g., silicon, sapphire, gallium-arsenide, etc.). For example, the logic 17 may include a transistor array and/or other integrated circuit components coupled to the substrate(s) 16 with transistor channel regions that are positioned within the substrate(s) 16. The interface between the logic 17 and the substrate(s) 16 may not be an abrupt junction. The logic 17 may also be considered to include an epitaxial layer that is grown on an initial wafer of the substrate(s) 16.

Turning now to FIGS. 3A to 3E, an embodiment of a method 20 of controlling storage may include controlling local access to a persistent storage media at block 21 and, in response to one or more commands: determining an intermediate parity value based on a first local parity calculation at block 22, and locally storing the intermediate parity value at block 23. The method 20 may also include determining a final parity value based on the intermediate parity value and a second local parity calculation at block 24, in response to the one or more commands. Some embodiments of the method 20 may include, in response to a first uni-directional command at block 25, reading an old data value from a first address indicated in the first uni-directional command at block 26, performing an XOR operation on the old data value and a new data value indicated in the first uni-directional command to determine the intermediate parity value at block 27, and locally storing the intermediate parity value at a first location associated to a first index indicated in the first uni-directional command at block 28. For example, in response to the first uni-directional command, the method 20 may further include writing the new data at the first address at block 29. Some embodiments of the method 20 may further include, in response to a second uni-directional command at block 30, reading an intermediate parity value from a second location associated to a second index indicated in the second uni-directional command at block 31, and storing the intermediate parity value at a second address indicated in the second uni-directional command at block 32.

Some embodiments of the method 20 may further include, in response to a third uni-directional command at block 33, reading an old parity data value from a third address indicated in the third uni-directional command at block 34, and locally storing the old parity data value at a third location associated to a third index indicated in the third uni-directional command at block 35. For example, in response to the third uni-directional command, the method 20 may further include performing the second parity calculation based on the old parity data value, an intermediate parity value indicated in the third uni-directional command, and a coefficient value indicated in the third uni-directional command to determine the final parity value at block 36, and writing the final parity value at the third address at block 37.

Some embodiments of the method 20 may further include, in response to a fourth uni-directional command at block 38, reading an old data value from a fourth address indicated in the fourth uni-directional command at block 39, performing an XOR operation on the old data value and a new data value indicated in the fourth uni-directional command to determine the intermediate parity value at block 40, performing a multiplication operation based on the intermediate parity value and a coefficient value indicated in the fourth uni-directional command to determine the final parity value at block 41, and writing the final parity value at a fifth address indicated in the fourth uni-directional command at block 42. In any of the embodiments herein, the persistent storage media may comprise a SSD at block 43.

Embodiments of the method 20 may be implemented in a system, apparatus, computer, device, etc., for example, such as those described herein. More particularly, hardware implementations of the method 20 may include configurable logic such as, for example, PLAs, FPGAs, CPLDs, or in fixed-functionality logic hardware using circuit technology such as, for example, ASIC, CMOS, or TTL technology, or any combination thereof. Alternatively, or additionally, the method 20 may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C# or the like and conventional procedural programming languages, such as the "C" programming language or similar programming languages.

For example, the method 20 may be implemented on a computer readable medium as described in connection with Examples 25 to 32 below. Embodiments or portions of the method 20 may be implemented in firmware, applications (e.g., through an application programming interface (API)), or driver software running on an operating system (OS). Additionally, logic instructions might include assembler instructions, instruction set architecture (ISA) instructions, machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, etc.).

Some embodiments may advantageously provide technology for on-SSD erasure coding (EC) without using bi-directional commands. EC-based storage technology requires additional computation of parity. This is done by reading old data and old parities, re-computing the parities given the new data, and storing the new data and the new parities. A central component of a conventional EC-based storage system may include a storage controller entity (e.g., a RAID host bus adapter (HBA) or similar software), which is a centralized entity that exposes storage volume(s) to other entities, orchestrates all EC flows, and performs the necessary computations. For the purpose of a random write operation, which turns in to partial stripe writes, the entity generates a large number of read and write operations against member drives and uses a central storage controller computation engine to perform the necessary data computations.

The centralized entity must first obtain all the data necessary to perform the parity computations, generally including data from both a requestor side and data from the member drives. After performing computations, the centralized entity needs to write all the data and calculated parity data to the member drives. In a conventional EC-based storage system, for example this requires P+1 data transfers to read the old parities and data, and P+1 data transfers to save the updates, with the parity computation being performed at the centralized storage controller. For example, in an example 8+3 EC system, every random write turns into eight (8) data transfers (e.g., 3+1+3+1, where P=3), which corresponds to an 800% data transfer overhead.

This high overhead of data transfers from and to the centralized storage controller consumes local (e.g., PCIe) and/or remote (e.g., Ethernet) interfaces bandwidth and may ultimately limit the maximum storage performance of a conventional EC-based storage system. All the computations are also performed by the centralized storage controller entity, which can also be a bottleneck for a large system performance. Some other EC-based systems may utilize bi-directional commands to reduce the overhead (e.g., a single command to move data from host memory to a member drive and drive data from the member drive to host memory). The use of such bi-directional commands, however, is difficult or impractical to implement in a scalable EC-based storage system. Some other EC-based systems may include technology to offload XOR operations, but such operations have limited scope in terms of supporting more complex EC-based storage systems.

Advantageously, some embodiments may provide advanced EC offload technology to overcome one or more of the foregoing problems with conventional EC-based storage systems. Some embodiments may advantageously support generalized EC-levels. Some embodiments may also advantageously utilize uni-directional commands (e.g., a single command which involves only a single transfer of data between host memory and a member drive) to simplify the implementation for scalable EC-based storage systems. Some embodiments may offload complex math operations (e.g., multiplication) from the EC controller to the member drives to advantageously reduce network traffic and computation overhead from the centralized storage controller.

WriteAndXor, SaveEC, and ECwrite Example

Without being limited to specific implementations, an embodiment may introduce the following three (3) SSD commands to move the complex math operations to SSD member drives: 1) WriteAndXor (Logical Block Address (LBA) L, Data D, Descriptor $CD_{idx}$): This command places XOR of old data and new data to a temporary location, indexed by the specified descriptor; 2) SaveEC (Descriptor $CD_{idx}$, Memory Address M): This command reads a temporary location specified by a descriptor and places the results in a memory address M. Space at the memory address M is allocated by the central storage controller, and may be allocated in host memory, a persistent memory region (PMR), an internal memory buffer (IMB), a control memory buffer (CMB), etc.; and 3) ECwrite (LBA L, Data X, Data g): This command reads the old (parity) data at LBA L and saves it at a temporary location specified by the $CD_{idx}$ descriptor. This command also updates the data at L with the parity calculation result computed using, for example, Galois-field (GF) math with parameters g and intermediate parity value X (e.g., from memory address M).

An embodiment of a central storage controller may include technology to detect the availability of these commands on the constituent SSDs (e.g., a query of the device capability or compatibility), and to orchestrate the operations. The central storage controller may also include technology to maintain a list of indexes which are currently in use and to pick an index which is currently not in use when initiating a new flow of commands for purpose of random-writes and/or a partial stripe write. Advantageously, some embodiments decrease the number of I/O operations against the member drives, offloads the CPU/hardware utilization of the central storage controller, and improves the scalability of an entire storage solution. For an example 8+3 EC, some embodiments eliminates the XOR operation and GF-multiplies on the central storage controller and reduces the number of data transfers on the bus/network from 8 to 5 (e.g., about a 40% reduction; see Table 1 below).

Table 1 shows an example comparison of XOR operations, GF-multiplications, and data transfers for a baseline conventional storage system versus an EC offload storage in accordance with an embodiment for a generalized M+P configuration and an example 8+3 (M=8, P=3) configuration. The rightmost two columns summarize the improvement provided in accordance with some embodiments (e.g., the reduction in data transfers and operations at the central storage controller).

TABLE 1

| | Baseline | | EC Offload | | Improvement (Reduction) | |
|---|---|---|---|---|---|---|
| Config => ↓Operations | M + P drives | 8 + 3 drives | M + P drives | 8 + 3 drives | M + P drives | 8 + 3 drives |
| Xors | (P + 1) | 4 | 0 | 0 | 100% | 100% |
| GF-mults | (P − 1) | 2 | 0 | 0 | 100% | 100% |
| Data xfers | 2 + 2P | 8 | 2 + P | 5 | P/(2 + 2P) | 37.5% |

Without being limited to specific implementations, the following commands may be implemented on a SSD that provides logic to implement the commands as indicated with the following pseudo-code (and as described in further detail herein):

WriteAndXor (LBA L, Data D, Descriptor $CD_{idx}$)

$Y_{idx}$ <= Read (L)XOR D//temp buffer indexed by $CD_{idx}$

Write(L, D)
SaveEC (Descriptor $CD_{idx}$, Memory Address M)

M <= $Y_{idx}$//M could be on host or in PMR, etc.

ECwrite (LBA L, Data X, Data g)

Y <= Read (L)//temp buffer

Write(L, Y XOR g*X)

With reference to FIGS. 4A to 4B, an embodiment of an electronic storage system 45 may include an EC controller 46 (e.g., a RAID controller such as RAID HBA, INTEL virtual RAID on CPU (VROC), etc.) communicatively coupled to a plurality of member drives 47 (e.g., a 2+2 EC configuration which includes SSD1 through SSD4, such as 4-drive RAID6 configuration) via a bus and/or network interface 48. In accordance with some embodiments, the EC controller 46 includes logic to orchestrate commands as illustrated with the flow numbered 1 through 7 in FIG. 4A, with further description of the operation of the EC controller 46 and member drives 47 shown in FIG. 4B.

The commands WriteAndXor and SaveEC are associated with each other using a command descriptor index ($CD_{idx}$), where $CD_{idx}$ is generated by a host/server node for the purpose of a given RAID operation and the host guarantees that there are no two outstanding RAID operations with the same $CD_{idx}$ at a time against the same drive. An intermediate result (Y idx) of the WriteAndXor command is staged on a buffer of an SSD drive (e.g., SSD1 as illustrated in FIG. 4A). The ECwrite parameter g may be a coefficient for a GF math calculation. The value of g may be set by a RAID logic and may depend on a RAID level (e.g., a number of parity drives in a stripe) and a parity drive index in a given RAID stripe.

At arrow 1, the EC controller 46 receives a Write(L', D1) command. At point 2, the EC controller 46 allocates IDX1 as the command descriptor index for SSD1 and space at memory address M1 in memory allocated to the EC controller 46 to hold an intermediate parity value X1. For example, the EC controller 46 may be a software entity running on a host computer and the EC controller 46 may allocate a portion of the host memory dedicated to the EC controller to hold the intermediate parity value X1. The EC controller 46 may also map the LBA L' to an LBA L1 for SSD1.

At arrow 3, the EC controller issues a command WriteAndXor(L1, D1, IDX1) to the SSD1. On the member drives 47, the WriteAndXor command is responsible for writing updated data to the target drive, while placing an intermediate parity calculation in a temporary buffer whose location is indicated by the specified descriptor. For example, the member drives 47 may each include EC offload logic to implement the commands. On SSD1, accordingly, the WriteAndXor(L1, D1, IDX1) command causes the EC offload logic to read the old data $OLD_{D1}$ from the LBA L1, perform an XOR operation on the old data and the new data D1 ($Y_{IDX1}$=D1 XOR $OLD_{D1}$), and save the intermediate parity value $Y_{IDX1}$ in a buffer at the location indicated by IDX1. The WriteAndXor(L1, D1, IDX1) command then causes the EC offload logic to write the new data D1 to the LBA L1.

At arrow 4, the EC controller 46 issues the command SaveEC(IDX1, M1) to SSD1. The SaveEC command causes the EC offload logic to take the computed intermediate parity value $Y_{IDX1}$ and place it in the memory address M1, which may be in host memory (e.g., a portion of host memory allocated to the EC controller 46, or in a PRM, CMB, IMB, etc.). At arrows 5 and 6, the EC controller takes the intermediate parity calculation X1 (e.g., read from memory address M1) and issues the ECwrite command to the parity drive(s) with the LBA L1, the data value X1, and respective suitable GF coefficients $g_0$ and $g_1$. Internally, the member drives SSD3, SSD4 complete the parity calculation and saves the result at the specified LBA. At arrow 7, the application is notified of the completion. Advantageously, in this embodiment, all of the EC solution computations for purpose of partial stripe write are offloaded to member drives. Some embodiments may advantageously demonstrate substantial improvement as compared to conventional RSTe technology in terms of input/output per second (IOPs), CPU utilization per I/O (relative %), average latency, and 99% QOS, and for a variety of configurations (e.g., RAID5, RAID6, etc.).

Figure 5:
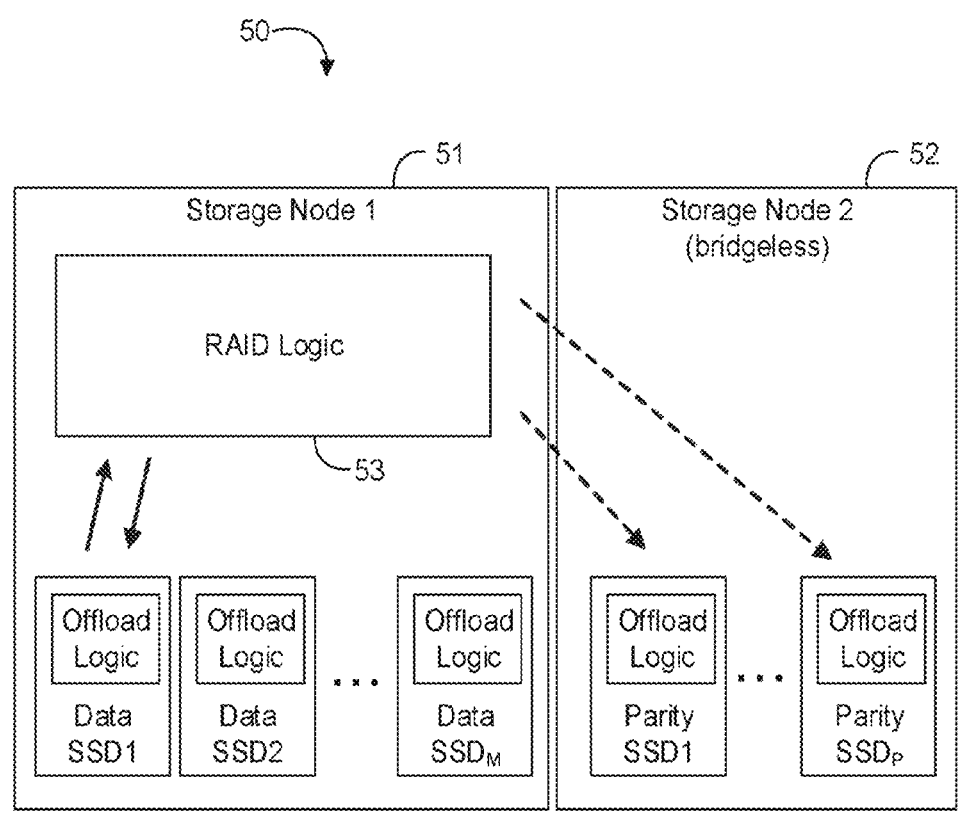
FIG. 5 is a block diagram of another example of an electronic storage system according to an embodiment.

With reference to FIG. 5, an embodiment of an electronic storage system 50 may include a first storage node 51 communicatively coupled to a second storage node 52 in a distributed RAID configuration. The solid arrows may represent local data transfer while the dashed arrows represent network data transfer. The first storage node 51 includes M data SSDs while the second storage mode 52 include P parity SSDs. The first storage node 51 includes RAID logic 53 as described herein to offload EC computations and each of the member SSDs includes offload logic to perform the EC computations. Advantageously, some embodiments decrease network bandwidth in the case of a distributed EC system. For example, the first storage node 51 does not need to read the data from the parity SSDs on the second storage node 52, thereby eliminating P data transfers (e.g., saving 50% of the network data transfers in a system with two parity drives). The illustrated embodiment also eliminates the parity calculation on the first storage node 51, advantageously reducing the compute complexity and overhead for the RAID logic 53.

ECrmw Examples

In some EC systems, there may be a partial update penalty. Partial update occurs when a stored file or chunk is partially modified. This leads to update of not only one corresponding source vector, but also several corresponding parity pieces. Some conventional EC systems, for example, may read out all unmodified source vectors from the different storage nodes in a storage system to one storage node, recalculate all parity vectors, and then replace the stale parity vectors with the new ones on the different storage nodes. All related storage nodes are involved for data update. More involved storage nodes will cause more complex interaction and higher latency, with more overhead for data transported through network and high calculation workload at the one storage node.

Some embodiments may overcome one or more of the foregoing problems with a vendor specific NVMe command to perform the EC operations on the storage device. Instead of calculating parity information on a central storage server, for example, some embodiments include technology for the storage device to perform the EC operations, including read out, GF calculation, and write back. In some embodiments, the storage device may be a NVMe drive or a NVMe over Fabric (NVMf) target. In some embodiments, a command for the storage device may indicate a LBA of stale parity data and a new expected LBA for new parity data, together with a multiplication coefficient (e.g. for the GF calculation). An embodiment of a suitably configured NVMe storage device may decode the command to perform an EC partial update calculation with a common XOR engine on the device.

Some embodiments may integrate the vendor specific NVMe command into firmware of a NVMe flash drive. Some embodiments may be configured as an expansion to NVMf target related software. Some embodiment may be integrated in a smart network interface (NIC) card. An embodiment of a storage system may be configured to determine if the EC offload code is deployed in the devices of the storage system and, if so, send the command just once to complete an EC partial update, instead of the conventional interoperation between the host server and storage device(s). Advantageously, some embodiments may improve both throughput and latency and may simplify related software logic.

Figure 6:
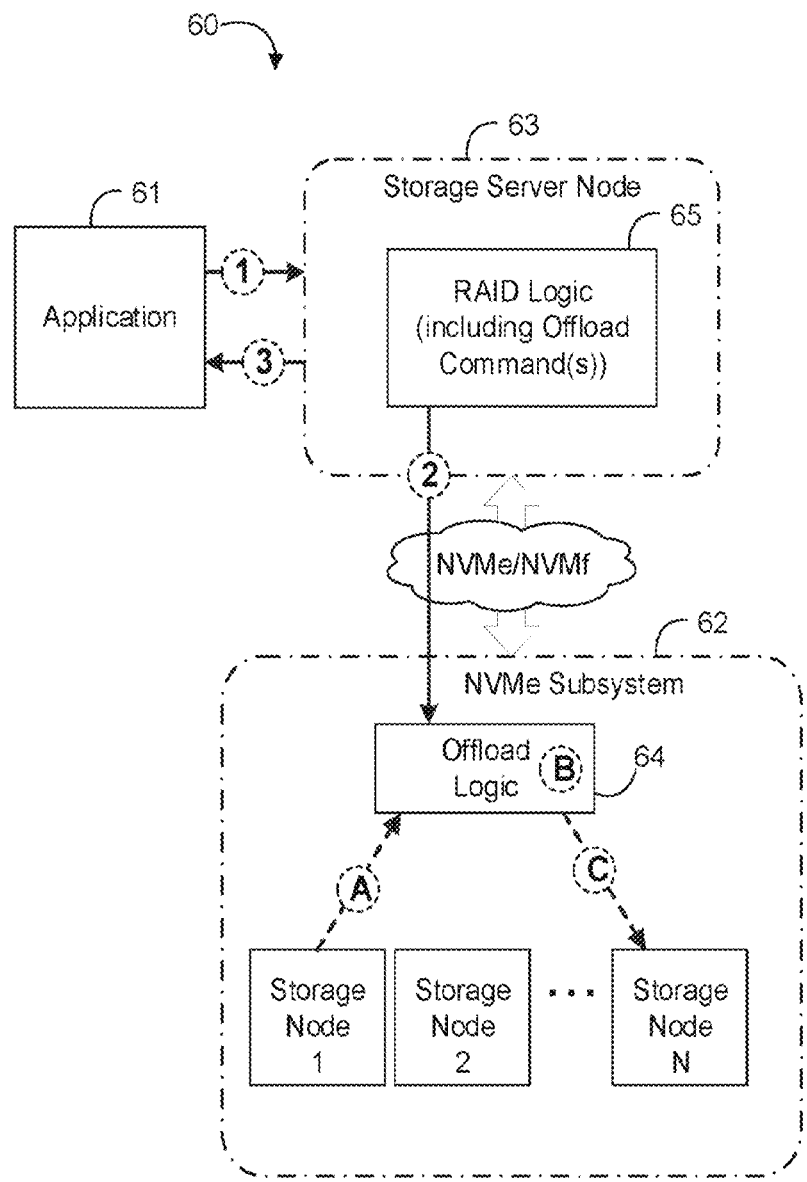
FIG. 6 is a block diagram of another example of an electronic storage system according to an embodiment.

With reference to FIG. 6, an embodiment of an electronic system 60 may include requestor 61 communicatively coupled to an NVMe subsystem 62 through a storage server node 63. For example, the storage server node 63 may be communicatively coupled to the NVMe subsystem 62 by a bus or network interface such as an NVMe interface, NVMf interface, etc. At arrow 1, the storage server node 63 receives delta data from the requestor 61 (e.g., another storage node, an application, a software agent, etc.). At arrow 2, RAID logic 65 on the storage server node 63 issues an ECrmw command filled with suitable data to the NVMe subsystem 62. Offload logic 64 (e.g., firmware) on the NVMe subsystem 62 directly transfers the delta data to the storage device(s). Internally, the offload logic will follow process the command to: read stale data out (arrow A), calculate new parity with input delta data (point B), and write back the new data (arrow C).

Advantageously, the operations caused by the ECrmw command are internal to the NVMe subsystem 62, so host server involvement is not required by the storage server node 63. Accordingly, some embodiments alleviate burdens of the host on multiple data manipulations and calculations while, at the same time, reducing operation latency. After the NVMe subsystem 62 receives both the ECrmw command and delta data, the storage server node 63 may proceed to indicate a successful response to the requestor 61 at arrow 3. Conventional read-modify-write EC operations consists of several steps between the server node and the storage nodes, so it is not one atomic operation. Advantageously, embodiments of the ECrmw command may perform read-modify-write as one atomic operation on drive (e.g., a uni-directional command). For upper level application, accordingly, the complex software logic to defend against lost data or data inconsistency can be removed or much simplified.

Without being limited to specific implementations, some embodiments of an EC storage system may perform EC related operations based on the following equation:

$$Pn' = \alpha_n(Dm' XOR\ Dm) XOR\ Pn \qquad [Eq.\ 1]$$

With reference to FIG. 7, an embodiment of a command format 70 for an example ECrmw command may include a plurality of 32 bits data words (Dwords) arranged as illustrated. The delta data is the data which needs to be transferred into storage device. The multiplication coefficient should also be realized by the device. Also, unlike a general read/write command, which only points out one LBA, in the ECrmw command both a last parity data LBA and a next new parity data LBA are specified to the storage device. The data length may be specified by number of blocks, and there may be specific metadata for the new parity. In general, the format of the ECrmw command may be similar to a general NVMe read/write command, with some differences including: the reserved segment in Dword 2 and 3 is used to contain the LBA for new parity data; a segment of Dword 10 and 11 is used to contain the LBA for the stale parity data;

a coefficient for the GF multiplication is contained in Byte2, Dword12, meta pointer segment of Dword 4 and 5 is pointed to the metadata buffer for new parity; and delta data pointer is referenced by physical page region (PRP) PRP1 and PRP2 (e.g., following NVMe Spec 1.3). Advantageously, the ECrmw command provides for information to be shared from a host to the storage device to perform read-modify-write for EC as an atomic operation.

Some embodiments involve cooperation between a host and a storage device. For example, NAND flash provides a read/write/erase interface. Within a NAND package, storage media is organized into a hierarchy of die, plane, chunk, and page. Within each plane, NAND is organized in chunks and pages. Each plane contains the same number of chunks, and each chunk contains the same number of pages. Pages are the minimal units of read and write, while the unit of erase is a chunk. There is less limitations for read operation, each read operation can be treated as random. But for write operation, which is also referred to as a program operation, there is a main limitation that inside each chunk, the program operation should be sequential appended inside each chunk. In other words, chunk only allows purely sequential write accesses. In order to fit in with NAND characteristics, a file translation layer (FTL) inside the storage device will be responsible to expose a traditional block I/O interface.

When doing data overwrite, FTL's common action is finding one new physical address for new data, marking original data physical address as abandoned, remap LBA with new physical address. Moreover, considering data reliability on the problem of synchronization in distributed system, an advanced storage system would like to keep the stale parity data, in case of data rollback due to some failures on other partner nodes. Especially for EC M+P (M is the number of source data, P is the number of parity data, it gives a redundancy of P nodes failure while guaranteeing data reliability). In order to guarantees any P nodes failure redundancy when doing read-modify-write. If directly overwriting the stale parity with new parity in each parity nodes, any unsuccessful node's writing will let these nodes in an inconsistent state, which causes the M+P EC loses its redundancy guarantee. That is to say retaining stale parity data together with new parity data is a key requirement for EC data update.

Accordingly, the data retention behavior of some embodiments both meets the functional requirement of host software, and the inherent characteristics of NAND flash which is the main media of NVMe/NVMf.

The technology discussed herein may be provided in various computing systems (e.g., including a non-mobile computing device such as a desktop, workstation, server, rack system, etc., a mobile computing device such as a smartphone, tablet, Ultra-Mobile Personal Computer (UMPC), laptop computer, ULTRABOOK computing device, smart watch, smart glasses, smart bracelet, etc., and/or a client/edge device such as an Internet-of-Things (IoT) device (e.g., a sensor, a camera, etc.)).

Figure 8:
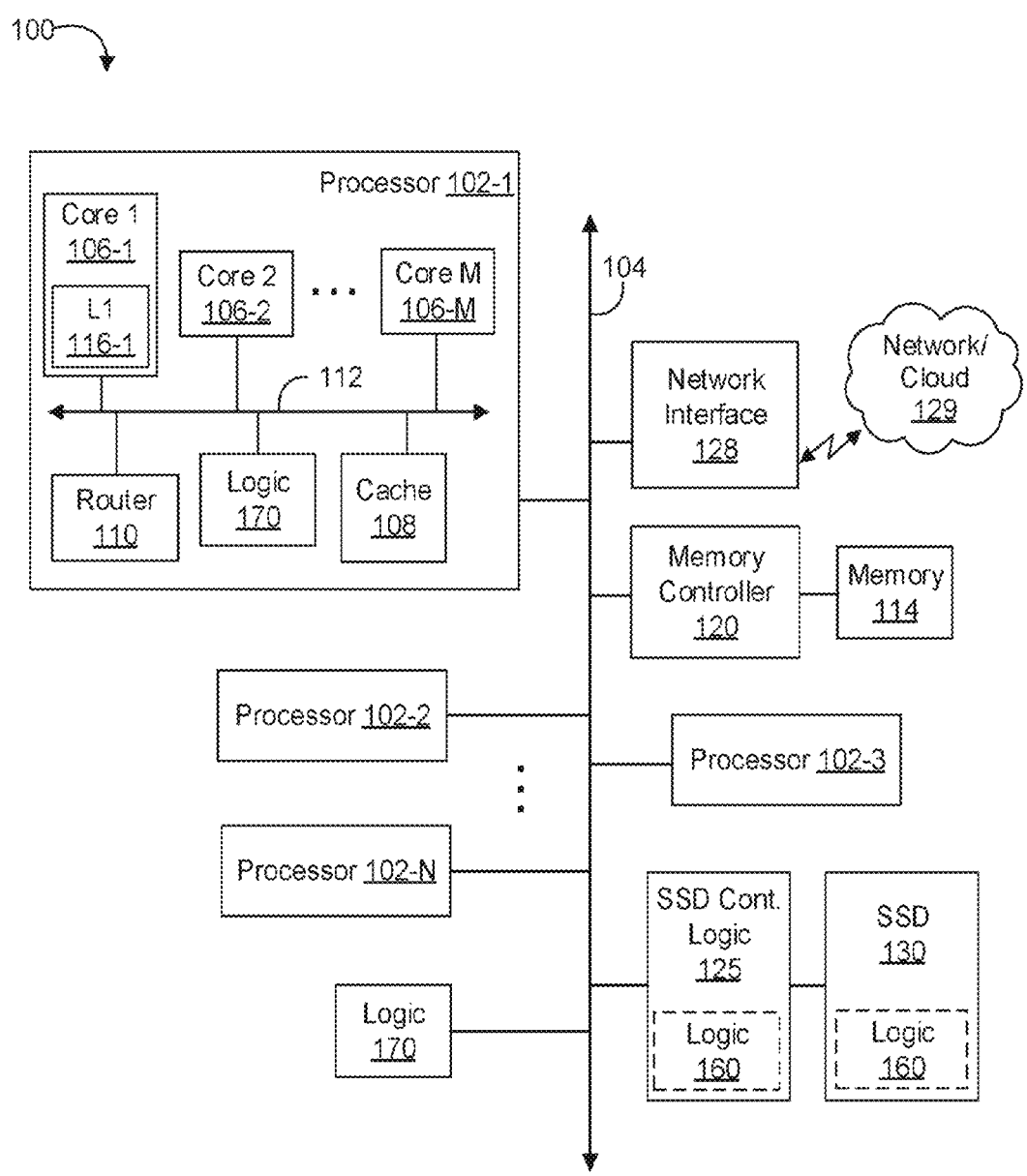
FIG. 8 is a block diagram of an example of a computing system according to an embodiment.

Turning now to FIG. 8, an embodiment of a computing device 100 may include one or more processors 102-1 through 102-N (generally referred to herein as "processors 102" or "processor 102"). The processors 102 may communicate via an interconnection or bus 104. Each processor 102 may include various components some of which are only discussed with reference to processor 102-1 for clarity. Accordingly, each of the remaining processors 102-2 through 102-N may include the same or similar components discussed with reference to the processor 102-1.

In some embodiments, the processor 102-1 may include one or more processor cores 106-1 through 106-M (referred to herein as "cores 106," or more generally as "core 106"), a cache 108 (which may be a shared cache or a private cache in various embodiments), and/or a router 110. The processor cores 106 may be implemented on a single integrated circuit (IC) chip. Moreover, the chip may include one or more shared and/or private caches (such as cache 108), buses or interconnections (such as a bus or interconnection 112), logic 170, memory controllers, or other components.

In some embodiments, the router 110 may be used to communicate between various components of the processor 102-1 and/or device 100. Moreover, the processor 102-1 may include more than one router 110. Furthermore, the multitude of routers 110 may be in communication to enable data routing between various components inside or outside of the processor 102-1.

The cache 108 may store data (e.g., including instructions) that is utilized by one or more components of the processor 102-1, such as the cores 106. For example, the cache 108 may locally cache data stored in a memory 114 for faster access by the components of the processor 102. As shown in FIG. 8, the memory 114 may be in communication with the processors 102 via the interconnection 104. In some embodiments, the cache 108 (that may be shared) may have various levels, for example, the cache 108 may be a mid-level cache and/or a last-level cache (LLC). Also, each of the cores 106 may include a level 1 (L1) cache (116-1) (generally referred to herein as "L1 cache 116"). Various components of the processor 102-1 may communicate with the cache 108 directly, through a bus (e.g., the bus 112), and/or a memory controller or hub.

As shown in FIG. 8, memory 114 may be coupled to other components of device 100 through a memory controller 120. Memory 114 may include volatile memory and may be interchangeably referred to as main memory. Even though the memory controller 120 is shown to be coupled between the interconnection 104 and the memory 114, the memory controller 120 may be located elsewhere in device 100. For example, memory controller 120 or portions of it may be provided within one of the processors 102 in some embodiments.

The device 100 may communicate with other devices/systems/networks via a network interface 128 (e.g., which is in communication with a computer network and/or the cloud 129 via a wired or wireless interface). For example, the network interface 128 may include an antenna (not shown) to wirelessly (e.g., via an Institute of Electrical and Electronics Engineers (IEEE) 802.11 interface (including IEEE 802.11a/b/g/n/ac, etc.), cellular interface, 3G, 4G, LTE, BLUETOOTH, etc.) communicate with the network/cloud 129.

Device 100 may also include a storage device such as a SSD device 130 coupled to the interconnect 104 via SSD controller logic 125. Hence, logic 125 may control access by various components of device 100 to the SSD device 130. Furthermore, even though logic 125 is shown to be directly coupled to the interconnection 104 in FIG. 8, logic 125 can alternatively communicate via a storage bus/interconnect (such as the SATA (Serial Advanced Technology Attachment) bus, Peripheral Component Interconnect (PCI) (or PCI EXPRESS (PCIe) interface), NVM EXPRESS (NVMe), etc.) with one or more other components of device 100 (for example where the storage bus is coupled to interconnect 104 via some other logic like a bus bridge, chipset, etc.) Additionally, logic 125 may be incorporated into memory controller logic (such as those discussed with reference to FIG. 9) or provided on a same integrated circuit (IC) device in various embodiments (e.g., on the same circuit board device as the SSD device 130 or in the same enclosure as the SSD device 130).

Furthermore, logic 125 and/or SSD device 130 may be coupled to one or more sensors (not shown) to receive information (e.g., in the form of one or more bits or signals) to indicate the status of or values detected by the one or more sensors. These sensor(s) may be provided proximate to components of device 100 (or other computing systems discussed herein), including the cores 106, interconnections 104 or 112, components outside of the processor 102, SSD device 130, SSD bus, SATA bus, logic 125, logic 160, logic 170, etc., to sense variations in various factors affecting power/thermal behavior of the system/platform, such as temperature, operating frequency, operating voltage, power consumption, and/or inter-core communication activity, etc.

Figure 9:
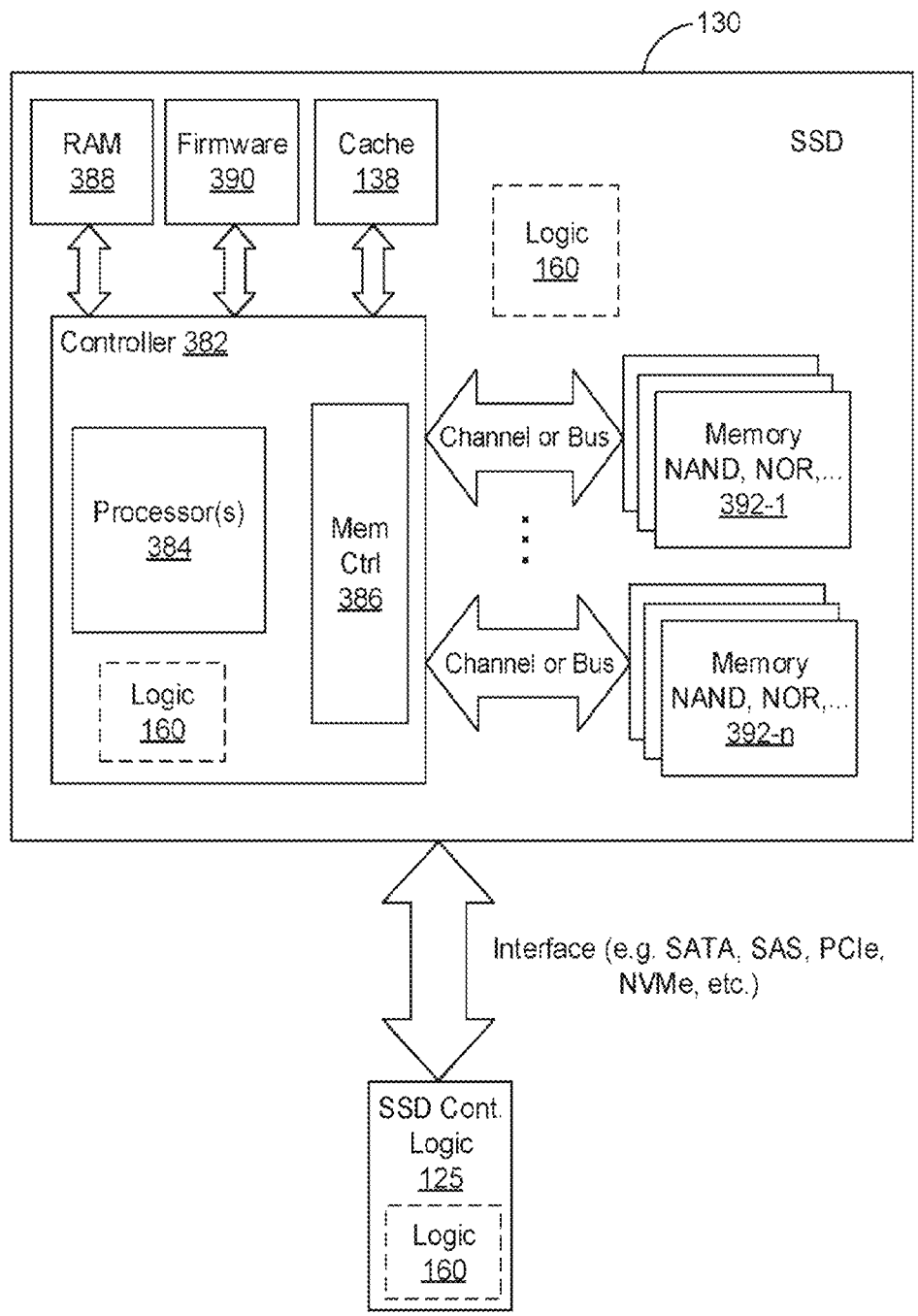
FIG. 9 is a block diagram of an example of a solid-state drive (SSD) according to an embodiment.

FIG. 9 illustrates a block diagram of various components of the SSD device 130, according to an embodiment. As illustrated in FIG. 9, logic 160 may be located in various locations such as inside the SSD device 130 or controller 382, etc., and may include similar technology as discussed in connection with FIG. 8. The SSD device 130 includes a controller 382 (which in turn includes one or more processor cores or processors 384 and memory controller logic 386), cache 138, RAM 388, firmware storage 390, and one or more memory devices 392-1 to 392-N (collectively memory 392, which may include NAND flash, NOR flash, or other types of non-volatile memory). The memory 392 is coupled to the memory controller logic 386 via one or more memory channels or busses. Also, SSD device 130 communicates with logic 125 via an interface (such as a SATA, SAS, PCIe, NVMe, etc., interface). One or more of the features/aspects/operations discussed with reference to FIGS. 1-7 may be performed by one or more of the components of FIG. 9. Processors 384 and/or controller 382 may compress/decompress (or otherwise cause compression/decompression of) data written to or read from memory devices 392-1 to 392-N. Also, one or more of the features/aspects/operations of FIGS. 1-7 may be programmed into the firmware 390. Further, SSD controller logic 125 may also include logic 160.

As illustrated in FIGS. 8 and 9, the SSD device 130 may include logic 160, which may be in the same enclosure as the SSD device 130 and/or fully integrated on a printed circuit board (PCB) of the SSD device 130. The device 100 may include further logic 170 outside of the SSD device 130. Advantageously, the logic 160 and/or logic 170 may include technology to implement one or more aspects of the device 10, the apparatus 15, the method 20 (FIGS. 3A to 3E), the system 45, the system 50, the system 60, the command format 70, and/or any of the features discussed herein. For example, the logic 170 may include technology to implement the host server/device/agent/RAID logic/EC controller aspects of the various embodiments described herein (e.g., sending commands/parameters to the SSD device 130 including the WriteAndXor, SaveEC, ECwrite, and ECrmw commands described herein together with the associated data, etc.).

For example, the logic 160 may include technology to control local access to the SSD device 130 (e.g., command logic, control logic, device logic, etc. for the SSD device 130 itself). In response to one or more commands (e.g., such as commands similar to the WriteAndXor, SaveEC, ECwrite, and ECrmw described herein), the logic 160 may be configured to determine an intermediate parity value based on a first local parity calculation, and locally store the intermediate parity value (e.g., in RAM 388). For example, the logic 160 may be further configured to determine a final parity value based on the intermediate parity value and a second local parity calculation, in response to the one or commands.

In some embodiments, in response to a WriteAndXor command, the logic 160 may be configured to read an old data value from an address indicated in the WriteAndXor command, perform an XOR operation on the old data value and a new data value indicated in the WriteAndXor command to determine the intermediate parity value, and locally store the intermediate parity value at a location associated to an index indicated in the WriteAndXor command. For example, in response to the WriteAndXor command, the logic 160 may be further configured to write the new data at the address indicated in the WriteAndXor command.

In some embodiments, in response to a SaveEC command, the logic 160 may be configured to read an intermediate parity value from a location associated to an index indicated in the SaveEC command, and store the intermediate parity value at an address indicated in the SaveEC command.

In some embodiments, in response to a ECwrite command, the logic 160 may be configured to read an old parity data value from an address indicated in the ECwrite command, and locally store the old parity data value at a location associated to an index indicated in the ECwrite command. For example, in response to the ECwrite command, the logic 160 may be further configured to perform the second parity calculation based on the old parity data value, an intermediate parity value indicated in the ECwrite command, and a coefficient value indicated in the ECwrite command to determine the final parity value, and write the final parity value at the address indicated in the ECwrite command.

In some embodiments, in response to a ECrmw command, the logic 160 may be configured to read an old data value from a first LBA indicated in the ECrmw command, perform an XOR operation on the old data value and a new data value indicated in the ECrmw command to determine the intermediate parity value, perform a multiplication operation based on the intermediate parity value and a coefficient value indicated in the ECrmw command (e.g., XOR'd with an old parity data value in accordance with Eq. 1) to determine the final parity value, and write the final parity value at a second LBA indicated in the ECrmw command.

In other embodiments, the SSD device 130 may be replaced with any suitable storage/memory technology/media. In some embodiments, the logic 160/170 may be coupled to one or more substrates (e.g., silicon, sapphire, gallium arsenide, printed circuit board (PCB), etc.), and may include transistor channel regions that are positioned within the one or more substrates. In other embodiments, the SSD device 130 may include two or more types of storage media. For example, the bulk of the storage may be NAND and may further include some faster, smaller granularity accessible (e.g., byte-addressable) NVM such as INTEL 3DXP media. The SSD device 130 may alternatively, or additionally, include persistent volatile memory (e.g., battery or capacitor backed-up DRAM or SRAM). For example, the SSD device 130 may include POWER LOSS IMMINENT (PLI) technology with energy storing capacitors. The energy storing capacitors may provide enough energy (power) to complete any commands in progress and to make sure that any data in the DRAMs/SRAMs is committed to the non-volatile NAND media. The capacitors may act as backup batteries for the persistent volatile memory. As shown in FIG. 8, features or aspects of the logic 160 and/or the logic 170 may be distributed throughout the device 100, and/or co-located/integrated with various components of the device 100.

Additional Notes and Examples

Example 1 includes an electronic apparatus, comprising one or more substrates, and logic coupled to the one or more substrates, the logic to control local access to a persistent storage media and, in response to one or more commands, to determine an intermediate parity value based on a first local parity calculation, locally store the intermediate parity value, and determine a final parity value based on the intermediate parity value and a second local parity calculation.

Example 2 includes the apparatus of Example 1, wherein, in response to a first uni-directional command, the logic is further to read an old data value from a first address indicated in the first uni-directional command, perform an exclusive-or operation on the old data value and a new data value indicated in the first uni-directional command to determine the intermediate parity value, and locally store the intermediate parity value at a first location associated to a first index indicated in the first uni-directional command.

Example 3 includes the apparatus of Example 2, wherein, in response to the first uni-directional command, the logic is further to write the new data at the first address.

Example 4 includes the apparatus of any of Examples 1 to 3, wherein, in response to a second uni-directional command, the logic is further to read an intermediate parity value from a second location associated to a second index indicated in the second uni-directional command, and store the intermediate parity value at a second address indicated in the second uni-directional command.

Example 5 includes the apparatus of any of Examples 1 to 4, wherein, in response to a third uni-directional command, the logic is further to read an old parity data value from a third address indicated in the third uni-directional command, and locally store the old parity data value at a third location associated to a third index indicated in the third uni-directional command.

Example 6 includes the apparatus of Example 5, wherein, in response to the third uni-directional command, the logic is further to perform the second parity calculation based on the old parity data value, an intermediate parity value indicated in the third uni-directional command, and a coefficient value indicated in the third uni-directional command to determine the final parity value, and write the final parity value at the third address.

Example 7 includes the apparatus of any of Examples 1 to 6, wherein, in response to a fourth uni-directional command, the logic is further to read an old data value from a fourth address indicated in the fourth uni-directional command, perform an exclusive-or operation on the old data value and a new data value indicated in the fourth uni-directional command to determine the intermediate parity value, perform a multiplication operation based on the intermediate parity value and a coefficient value indicated in the fourth uni-directional command to determine the final parity value, and write the final parity value at a fifth address indicated in the fourth uni-directional command.

Example 8 includes the apparatus of any of Examples 1 to 7, wherein the persistent storage media comprises a solid state drive.

Example 9 includes an electronic storage system, comprising persistent storage media, and a controller communicatively coupled to the persistent storage media, the controller including logic to control local access to the persistent storage media and, in response to one or more commands, to determine an intermediate parity value based on a first local parity calculation, locally store the intermediate parity value, and determine a final parity value based on the intermediate parity value and a second local parity calculation.

Example 10 includes the system of Example 9, wherein, in response to a first uni-directional command, the logic is further to read an old data value from a first address indicated in the first uni-directional command, perform an exclusive-or operation on the old data value and a new data value indicated in the first uni-directional command to determine the intermediate parity value, and locally store the intermediate parity value at a first location associated to a first index indicated in the first uni-directional command.

Example 11 includes the system of Example 10, wherein, in response to the first uni-directional command, the logic is further to write the new data at the first address.

Example 12 includes the system of any of Examples 9 to 11, wherein, in response to a second uni-directional command, the logic is further to read an intermediate parity value from a second location associated to a second index indicated in the second uni-directional command, and store the intermediate parity value at a second address indicated in the second uni-directional command.

Example 13 includes the system of any of Examples 9 to 12, wherein, in response to a third uni-directional command, the logic is further to read an old parity data value from a third address indicated in the third uni-directional command, and locally store the old parity data value at a third location associated to a third index indicated in the third uni-directional command.

Example 14 includes the system of Example 13, wherein, in response to the third uni-directional command, the logic is further to perform the second parity calculation based on the old parity data value, an intermediate parity value indicated in the third uni-directional command, and a coefficient value indicated in the third uni-directional command to determine the final parity value, and write the final parity value at the third address.

Example 15 includes the system of any of Examples 9 to 14, wherein, in response to a fourth uni-directional command, the logic is further to read an old data value from a fourth address indicated in the fourth uni-directional command, perform an exclusive-or operation on the old data value and a new data value indicated in the fourth uni-directional command to determine the intermediate parity value, perform a multiplication operation based on the intermediate parity value and a coefficient value indicated in the fourth uni-directional command to determine the final parity value, and write the final parity value at a fifth address indicated in the fourth uni-directional command.

Example 16 includes the system of any of Examples 9 to 15, wherein the persistent storage media comprises a solid state drive.

Example 17 includes a method of controlling storage, comprising controlling local access to a persistent storage media and, in response to one or more commands determining an intermediate parity value based on a first local parity calculation, locally storing the intermediate parity value, and determining a final parity value based on the intermediate parity value and a second local parity calculation.

Example 18 includes the method of Example 17, further comprising, in response to a first uni-directional command reading an old data value from a first address indicated in the first uni-directional command, performing an exclusive-or operation on the old data value and a new data value indicated in the first uni-directional command to determine the intermediate parity value, and locally storing the intermediate parity value at a first location associated to a first index indicated in the first uni-directional command.

Example 19 includes the method of Example 18, further comprising, in response to the first uni-directional command writing the new data at the first address.

Example 20 includes the method of any of Examples 17 to 19, further comprising, in response to a second uni-directional command reading an intermediate parity value from a second location associated to a second index indicated in the second uni-directional command, and storing the intermediate parity value at a second address indicated in the second uni-directional command.

Example 21 includes the method of Example 20, further comprising, in response to a third uni-directional command reading an old parity data value from a third address indicated in the third uni-directional command, and locally storing the old parity data value at a third location associated to a third index indicated in the third uni-directional command.

Example 22 includes the method of any of Examples 17 to 21, further comprising, in response to the third uni-directional command performing the second parity calculation based on the old parity data value, an intermediate parity value indicated in the third uni-directional command, and a coefficient value indicated in the third uni-directional command to determine the final parity value, and writing the final parity value at the third address.

Example 23 includes the method of any of Examples 17 to 22, further comprising, in response to a fourth uni-directional command reading an old data value from a fourth address indicated in the fourth uni-directional command, performing an exclusive-or operation on the old data value and a new data value indicated in the fourth uni-directional command to determine the intermediate parity value, performing a multiplication operation based on the intermediate parity value and a coefficient value indicated in the fourth uni-directional command to determine the final parity value, and writing the final parity value at a fifth address indicated in the fourth uni-directional command.

Example 24 includes the method of any of Examples 17 to 23, wherein the persistent storage media comprises a solid state drive.

Example 25 includes at least one non-transitory one machine readable medium comprising a plurality of instructions that, in response to being executed on a computing device, cause the computing device to control local access to a persistent storage media and, in response to one or more commands, to determine an intermediate parity value based on a first local parity calculation; locally store the intermediate parity value, and determine a final parity value based on the intermediate parity value and a second local parity calculation.

Example 26 includes the at least one non-transitory one machine readable medium of Example 25, comprising a plurality of further instructions that, in response to being executed on the computing device, and in response to a first uni-directional command, cause the computing device to read an old data value from a first address indicated in the first uni-directional command, perform an exclusive-or operation on the old data value and a new data value indicated in the first uni-directional command to determine the intermediate parity value, and locally store the intermediate parity value at a first location associated to a first index indicated in the first uni-directional command.

Example 27 includes the at least one non-transitory one machine readable medium of Example 26, comprising a plurality of further instructions that, in response to being executed on the computing device, and in response to the first uni-directional command, cause the computing device to write the new data at the first address.

Example 28 includes the at least one non-transitory one machine readable medium of any of Examples 25 to 27, comprising a plurality of further instructions that, in response to being executed on the computing device, and in response to a second uni-directional command, cause the computing device to read an intermediate parity value from a second location associated to a second index indicated in the second uni-directional command, and store the intermediate parity value at a second address indicated in the second uni-directional command.

Example 29 includes the at least one non-transitory one machine readable medium of any of Examples 25 to 28, comprising a plurality of further instructions that, in response to being executed on the computing device, and in response to a third uni-directional command, cause the computing device to read an old parity data value from a third address indicated in the third uni-directional command, and locally store the old parity data value at a third location associated to a third index indicated in the third uni-directional command.

Example 30 includes the at least one non-transitory one machine readable medium of Example 29, comprising a plurality of further instructions that, in response to being executed on the computing device, and in response to the third uni-directional command, cause the computing device to perform the second parity calculation based on the old parity data value, an intermediate parity value indicated in the third uni-directional command, and a coefficient value indicated in the third uni-directional command to determine the final parity value, and write the final parity value at the third address.

Example 31 includes the at least one non-transitory one machine readable medium of any of Examples 25 to 30, comprising a plurality of further instructions that, in response to being executed on the computing device, and in response to a fourth uni-directional command, cause the computing device to read an old data value from a fourth address indicated in the fourth uni-directional command, perform an exclusive-or operation on the old data value and a new data value indicated in the fourth uni-directional command to determine the intermediate parity value, perform a multiplication operation based on the intermediate parity value and a coefficient value indicated in the fourth uni-directional command to determine the final parity value, and write the final parity value at a fifth address indicated in the fourth uni-directional command.

Example 32 includes the at least one non-transitory one machine readable medium of any of Examples 25 to 31, wherein the persistent storage media comprises a solid state drive.

Example 33 includes a storage device controller apparatus, comprising means for controlling local access to a persistent storage media and, in response to one or more commands means for determining an intermediate parity value based on a first local parity calculation, means for locally storing the intermediate parity value, and means for determining a final parity value based on the intermediate parity value and a second local parity calculation.

Example 34 includes the apparatus of Example 33, further comprising, in response to a first uni-directional command means for reading an old data value from a first address indicated in the first uni-directional command, means for performing an exclusive-or operation on the old data value and a new data value indicated in the first uni-directional command to determine the intermediate parity value, and means for locally storing the intermediate parity value at a first location associated to a first index indicated in the first uni-directional command.

Example 35 includes the apparatus of Example 34, further comprising, in response to the first uni-directional command means for writing the new data at the first address.

Example 36 includes the apparatus of any of Examples 33 to 35, further comprising, in response to a second uni-directional command means for reading an intermediate parity value from a second location associated to a second index indicated in the second uni-directional command, and means for storing the intermediate parity value at a second address indicated in the second uni-directional command.

Example 37 includes the apparatus of any of Examples 33 to 36, further comprising, in response to a third uni-directional command means for reading an old parity data value from a third address indicated in the third uni-directional command, and means for locally storing the old parity data value at a third location associated to a third index indicated in the third uni-directional command.

Example 38 includes the apparatus of Example 37, further comprising, in response to the third uni-directional command means for performing the second parity calculation based on the old parity data value, an intermediate parity value indicated in the third uni-directional command, and a coefficient value indicated in the third uni-directional command to determine the final parity value, and means for writing the final parity value at the third address.

Example 39 includes the apparatus of any of Examples 33 to 38, further comprising, in response to a fourth uni-directional command means for reading an old data value from a fourth address indicated in the fourth uni-directional command, means for performing an exclusive-or operation on the old data value and a new data value indicated in the fourth uni-directional command to determine the intermediate parity value, means for performing a multiplication operation based on the intermediate parity value and a coefficient value indicated in the fourth uni-directional command to determine the final parity value, and means for writing the final parity value at a fifth address indicated in the fourth uni-directional command.

Example 40 includes the apparatus of any of Examples 33 to 39, wherein the persistent storage media comprises a solid state drive.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C. Various components of the systems described herein may be implemented in software, firmware, and/or hardware and/or any combination thereof. For example, various components of the systems or devices discussed herein may be provided, at least in part, by hardware of a computing SoC such as may be found in a computing system such as, for example, a smart phone. Those skilled in the art may recognize that systems described herein may include additional components that have not been depicted in the corresponding figures. For example, the systems discussed herein may include additional components such as bit stream multiplexer or de-multiplexer modules and the like that have not been depicted in the interest of clarity.

While implementation of the example processes discussed herein may include the undertaking of all operations shown in the order illustrated, the present disclosure is not limited in this regard and, in various examples, implementation of the example processes herein may include only a subset of the operations shown, operations performed in a different order than illustrated, or additional operations.

In addition, any one or more of the operations discussed herein may be undertaken in response to instructions provided by one or more computer program products. Such program products may include signal bearing media providing instructions that, when executed by, for example, a processor, may provide the functionality described herein. The computer program products may be provided in any form of one or more machine-readable media. Thus, for example, a processor including one or more graphics processing unit(s) or processor core(s) may undertake one or more of the blocks of the example processes herein in response to program code and/or instructions or instruction sets conveyed to the processor by one or more machine-readable media. In general, a machine-readable medium may convey software in the form of program code and/or instructions or instruction sets that may cause any of the devices and/or systems described herein to implement at least portions of the operations discussed herein and/or any portions the devices, systems, or any module or component as discussed herein.

As used in any implementation described herein, the term "module" refers to any combination of software logic, firmware logic, hardware logic, and/or circuitry configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, fixed function circuitry, execution unit circuitry, and/or firmware that stores instructions executed by programmable circuitry. The modules may, collectively or individually, be embodied as circuitry that forms part of a larger system, for example, an integrated circuit (IC), system on-chip (SoC), and so forth.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as IP cores may be stored on a tangible, machine readable medium and supplied to various customers or manufacturing facilities to load into the fabrication machines that actually make the logic or processor.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the embodiments are not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. An erasure coding (EC) controller, comprising:
one or more substrates;
EC controller memory; and
logic coupled to the one or more substrates, the logic configured to control access to a persistent storage media and, in response to one or more commands, the logic is further configured to:
determine an intermediate parity value based on a first parity calculation by sending a uni-directional command to the persistent storage media,
store, in the EC controller memory, the intermediate parity value, and
determine a final parity value based on the intermediate parity value and a second parity calculation.

2. The EC controller of claim 1, wherein to determine the intermediate parity value, the logic is configured to determine the intermediate parity value based on the first parity calculation of an erasure coding (EC) offload logic of the persistent storage media.

3. The EC controller of claim 2, wherein to determine the intermediate parity value the logic is configured to send, the uni-directional command to the EC offload logic to cause the EC offload logic to:
read an old data value from a first address indicated in the uni-directional command;
perform an exclusive-or operation on the old data value and a new data value indicated in the uni-directional command to determine the intermediate parity value; and store in the persistent storage media the intermediate parity value at a first location associated to a first index indicated in the uni-directional command.

4. The EC controller of claim 3, wherein, the uni-directional command causes the EC offload logic to:
write the new data value at the first address.

5. The EC controller of claim 2, wherein the intermediate parity value is a first intermediate parity value and the logic is further configured to send a second uni-directional command to cause the EC offload logic to:
read a second intermediate parity value from a second location associated to a second index indicated in the second uni-directional command; and
store the second intermediate parity value at a second address indicated in the second uni-directional command.

6. The EC controller of claim 5, wherein the second intermediate parity value is the first intermediate parity value.

7. The EC controller of claim 1, wherein the persistent storage media comprises a solid state drive.

8. An electronic storage system, comprising:
persistent storage media; and
an erasure coding (EC) controller communicatively coupled to the persistent storage media, the EC controller including EC controller memory and logic configured to control access to the persistent storage media and, in response to one or more commands, the logic is further configured to:
determine an intermediate parity value based on a first parity calculation by sending a uni-directional command to the persistent storage media,
store, in the EC controller memory, the intermediate parity value, and
determine a final parity value based on the intermediate parity value and a second parity calculation.

9. The system of claim 8, wherein the persistent storage media comprises erasure coding (EC) offload logic configured to:
perform the first parity calculation; and
receive the uni-directional command.

10. The system of claim 9, wherein, in response to the uni-directional command, the EC offload logic is further configured to:
read an old parity data value from an address indicated in the uni-directional command; and
store the old parity data value at a location associated to an index indicated in the uni-directional command.

11. The system of claim 10, wherein the intermediate parity value is a first intermediate parity value and in response to the uni-directional command, the EC offload logic is further configured to:
perform the second parity calculation based on the old parity data value, a second intermediate parity value indicated in the uni-directional command, and a coefficient value indicated in the uni-directional command to determine the final parity value; and
write the final parity value at the address.

12. The system of claim 11, wherein the second intermediate parity value is the first intermediate parity value.

13. The system of claim 9, wherein, in response to a second uni-directional command, the EC offload logic is further to:
read an old data value from a second address indicated in the second uni-directional command;

perform an exclusive-or operation on the old data value and a new data value indicated in the second uni-directional command to determine the intermediate parity value; and store in the persistent storage media the intermediate parity value at a second location associated to a second index indicated in the second uni-directional command.

14. The system of claim 9, wherein the persistent storage media comprises a solid state drive.

15. A method of controlling storage, comprising:
controlling, by an erasure coding (EC) controller, access to a persistent storage media and, in response to one or more commands:
determining an intermediate parity value based on a first parity calculation by sending a uni-directional command to the persistent storage media,
storing, in a memory of the EC controller, the intermediate parity value; and
determining a final parity value based on the intermediate parity value and a second parity calculation.

16. The method of claim 15, wherein determining the intermediate parity value comprises determining the intermediate parity value based on the first parity calculation by an erasure coding (EC) offload logic of the persistent storage media.

17. The method of claim 16, further comprising, in response to the sending of the uni-directional command to the persistent storage media:
reading an old data value from a first address indicated in the uni-directional command;
performing an exclusive-or operation on the old data value and a new data value indicated in the uni-directional command to determine the intermediate parity value; and
storing in the persistent storage media the intermediate parity value at a first location associated to a first index indicated in the uni-directional command.

18. The method of claim 17, further comprising, in response to the sending of the uni-directional command to the persistent storage media:
writing the new data value at the first address.

19. The method of claim 15, further comprising sending a second uni-directional command to the persistent storage media and in response to sending the second uni-directional command to the persistent storage media:
reading an old parity data value from a second address indicated in the second uni-directional command; and
storing the old parity data value at a second location associated to a second index indicated in the second uni-directional command.

20. The method of claim 19, wherein the intermediate parity value is a first intermediate parity value and the method further comprising, in response to the sending of the second uni-directional command to the persistent storage media:
performing the second parity calculation based on the old parity data value, a second intermediate parity value indicated in the second uni-directional command, and a coefficient value indicated in the second uni-directional command to determine the final parity value; and
writing the final parity value at the second address.

21. The method of claim 20, wherein the second intermediate parity value is the first intermediate parity value.

22. At least one non-transitory machine readable medium comprising a plurality of instructions that, in response to being executed on an erasure coding (EC) controller comprising EC controller memory, cause the EC controller to control access to a persistent storage media and, in response to one or more commands:
determine an intermediate parity value based on a first parity calculation by sending a uni-directional command to the persistent storage media;
store, in the EC controller memory, the intermediate parity value; and
determine a final parity value based on the intermediate parity value and a second parity calculation.

23. The at least one non-transitory machine readable medium of claim 22, wherein to determine the intermediate parity value, the EC controller is configured to determine the intermediate parity value based on the first parity calculation of an erasure coding (EC) offload logic of the persistent storage media.

24. The at least one non-transitory machine readable medium of claim 23, comprising a plurality of further instructions that, in response to being executed on the EC controller, and in response to sending the uni-directional command to the persistent storage media, cause the EC offload logic to:
read an old data value from a first address indicated in the uni-directional command;
perform an exclusive-or operation on the old data value and a new data value indicated in the uni-directional command to determine the intermediate parity value;
perform a multiplication operation based on the intermediate parity value and a coefficient value indicated in the uni-directional command to determine the final parity value; and
write the final parity value at a second address indicated in the uni-directional command.

25. The at least one non-transitory machine readable medium of claim 23, wherein the intermediate parity value is a first intermediate parity value and the at least one non-transitory machine readable medium comprising a plurality of further instructions that, in response to being executed on the EC controller, and in response to sending a second uni-directional command to the persistent storage media, cause the EC offload logic to:
read a second intermediate parity value from a second location associated to a second index indicated in the second uni-directional command; and
store the second intermediate parity value at a third address indicated in the second uni-directional command.

26. The at least one non-transitory machine readable medium of claim 25, wherein the second intermediate parity value is the first intermediate parity value.

27. The at least one non-transitory machine readable medium of claim 22, wherein the persistent storage media comprises a solid state drive.

* * * * *